(12) United States Patent
Kumar et al.

(10) Patent No.: US 12,501,546 B2
(45) Date of Patent: Dec. 16, 2025

(54) FIBER WEAVE IN A PRINTED CIRCUIT BOARD SUBSTRATE

(71) Applicant: DELL PRODUCTS L.P., Round Rock, TX (US)

(72) Inventors: Sanjay Kumar, Bangalore (IN); Sathvika Bandi, Kothagudem (IN); Sukumar Muthusamy, Erode (IN); Naga Hara Sathya Sree Tammisetti, Hyderabad (IN); Arun Vignesh Palanichamy, Palani (IN); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 210 days.

(21) Appl. No.: 18/363,106

(22) Filed: Aug. 1, 2023

(65) Prior Publication Data

US 2025/0048549 A1 Feb. 6, 2025

(51) Int. Cl.
*H05K 1/03* (2006.01)
*H05K 1/02* (2006.01)

(52) U.S. Cl.
CPC ......... *H05K 1/0366* (2013.01); *H05K 1/0245* (2013.01); *H05K 2201/029* (2013.01)

(58) Field of Classification Search
CPC .................. H05K 1/0245; H05K 2201/029
See application file for complete search history.

(56) References Cited

U.S. PATENT DOCUMENTS

| | | | |
|---|---|---|---|
| 7,292,454 B2 | 11/2007 | Farkas et al. | |
| 2007/0190879 A1* | 8/2007 | Gondoh | D03D 1/0082 428/292.1 |
| 2009/0169842 A1* | 7/2009 | Morita | H05K 1/0366 428/209 |
| 2011/0232949 A1* | 9/2011 | Yamada | H05K 1/0245 156/64 |
| 2020/0259242 A1 | 8/2020 | Aurongzeb et al. | |

* cited by examiner

*Primary Examiner* — Timothy J Thompson
*Assistant Examiner* — John B Freal
(74) *Attorney, Agent, or Firm* — Larson Newman, LLP

(57) ABSTRACT

A printed circuit board substrate including multiple sets of glass rows. The multiple sets of glass rows include a first set of glass rows, a second set of glass rows, and a third set of glass rows. The first set of glass rows extend in a first direction. The second set of glass rows extend in a second direction that is perpendicular to the first direction. The third set of glass rows extend in a third direction that is parallel to the first direction. The resin holds the multiple sets of glass rows together and to fill pockets between the multiple of sets of glass rows.

15 Claims, 5 Drawing Sheets

FIBER WEAVE IN A PRINTED CIRCUIT BOARD SUBSTRATE

FIELD OF THE DISCLOSURE

The present disclosure generally relates to information handling systems, and more particularly relates to a fiber weave in a printed circuit board substrate.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A printed circuit board substrate including multiple sets of glass rows. The multiple sets of glass rows include a first set of glass rows, a second set of glass rows, and a third set of glass rows. The first set of glass rows extend in a first direction. The second set of glass rows extend in a second direction that is perpendicular to the first direction. The third set of glass rows extend in a third direction that is parallel to the first direction. The resin may hold the multiple sets of glass rows together and to fill pockets between the multiple of sets of glass rows.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
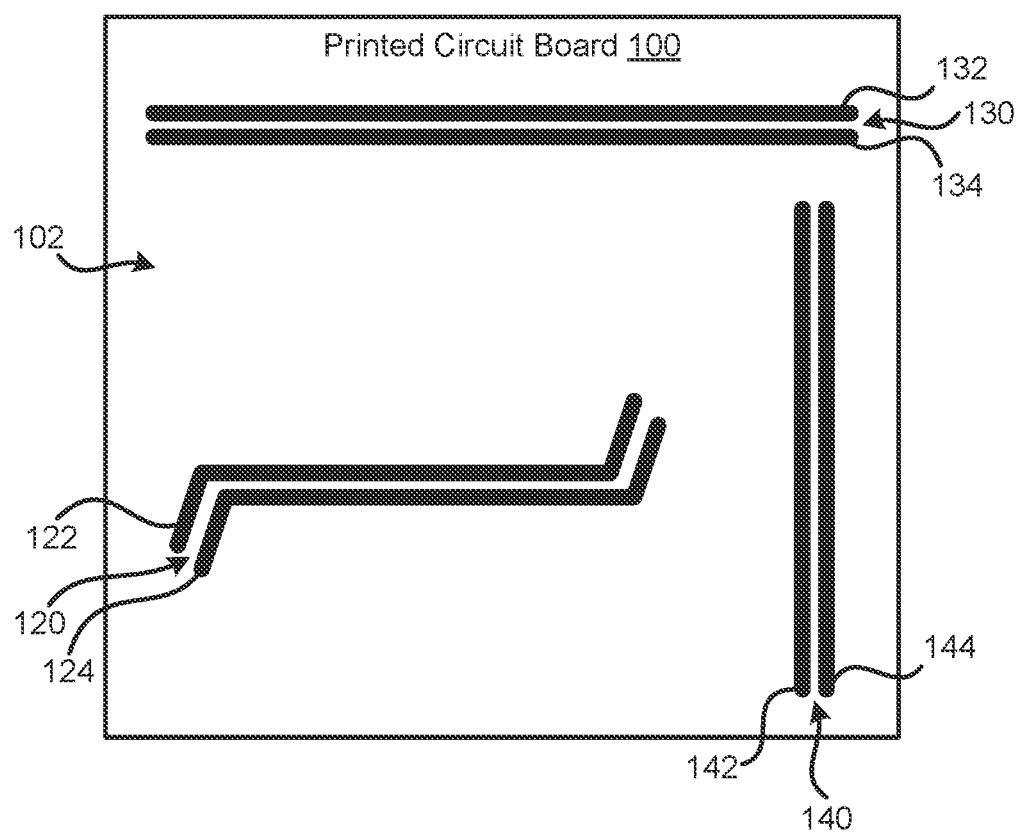
FIG. 1 is a diagram of a top view of a printed circuit board according to at least one embodiment of the present disclosure.

FIG. 1 illustrates a printed circuit board 100 for an information handling system according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Printed circuit board 100 includes a substrate 102 and multiple differential pairs 120, 130, and 140. Differential pair 120 includes traces 122 and 124, differential pair 130 includes traces 132 and 134, and differential pair 140 includes traces 142 and 144. In an example, substrate 102 may be formed from multiple materials, such as glass and resin. In certain examples, the glass rows may be formed from any suitable type of glass including, but not limited to, sapphire glass, tempered glass, and quartz glass. The resin of the printed circuit board substrate may be any suitable resin material, such as FR-4 resin.

In an example, the glass portion of printed circuit board substrate 102 may not be continuous from edge-to-edge. For example, the glass may be a fiber weave, such that there are pockets without glass within printed circuit board substrate 102. These pockets may only include the resin material of printed circuit board substrate 102. In certain examples, the dielectric constant for the glass portion and the resin portion may be different. An exemplary dielectric constant for a glass is 6.5, and an exemplary dielectric constant for resin is 3.

In certain examples, the speed of signals transmitted along differential pairs 120, 130, and 140 may vary based on the average dielectric constant of printed circuit board substrate 102 below the traces of the differential pairs. In an example, if there is a mismatch between the dielectric constant under the traces of a differential pair, a skew may be created between the signals transmitted on the traces. For example, if trace 122 of differential pair 120 is located above a glass portion and trace 124 is located above alternating glass and resin portion, a skew may be generated between the traces. In this example, a signal on trace 122 may travel slower than a signal on trace 124 because the dielectric constant for glass is higher than the dielectric constant of resin. In certain examples, a fiber weave effect may be created based on the dielectric constant mismatch between traces of a differential pair, such as traces 122 and 124 of differential pair 120. Based on the size of resin pockets within printed circuit board substrate 102 being reduced, transmission of high-speed signals on differential pairs 120, 130, and 140 may be improved as compared to previous printed circuit board substrates.

FIGS. 2-5 illustrate different manufacturing stages of a printed circuit board substrate 200 according to at least one embodiment of the present disclosure. Printed circuit board substrate 200 may include an outer edge 202. In certain examples, outer edge 202 may be any distance from glass rows formed within printed circuit board substrate 200 without varying from the scope of this disclosure.

Figure 2:
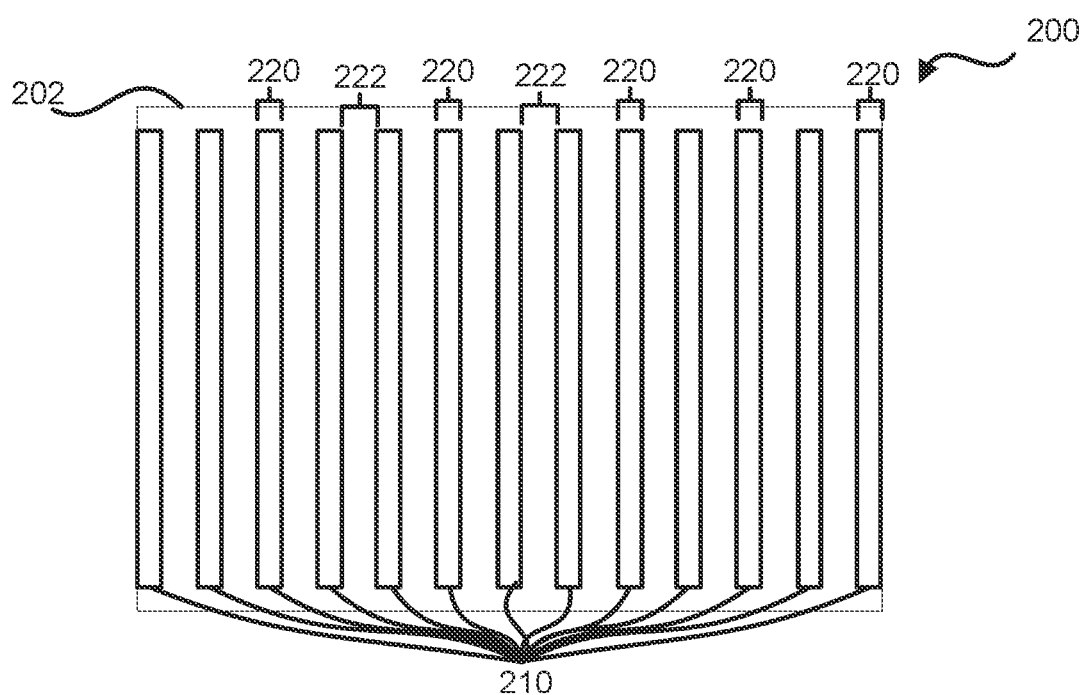
FIGS. 2-5 are diagram of a manufacturing stages of a printed circuit board substrate according to at least one embodiment of the present disclosure.

Referring now to FIG. 2, a first set of glass rows 210 may be formed within printed circuit board substrate 200. In an example, rows 210 may extend in any suitable direction across printed circuit board substrate 200 from one edge 202 to another. For example, the direction of rows 210 may include, but is not limited to, horizontal rows, vertical rows, and diagonal rows. In certain examples, glass rows 210 may be formed from any suitable type of glass including, but not limited to, sapphire glass, tempered glass, and quartz glass. In an example, each glass row 210 may have substantially the same width 220 as each other glass row. Additionally, a width 222 of the space between adjacent glass rows 220 may be substantially the same width as each individual glass row 220.

Figure 3:
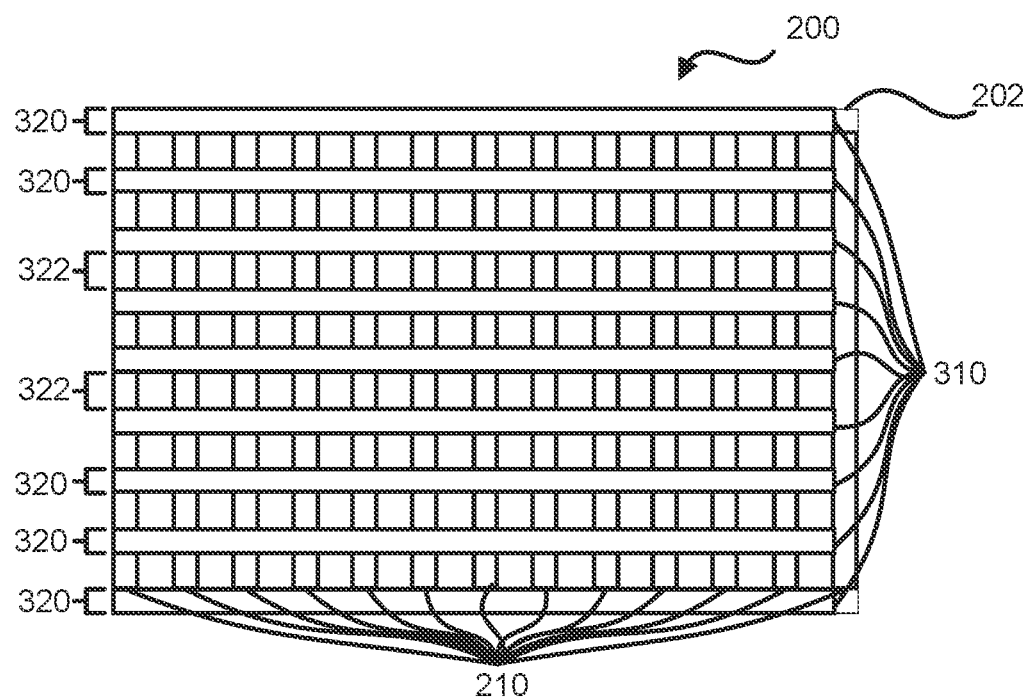

Referring now to FIG. 3, a second set of glass rows 310 may be formed within printed circuit board substrate 200. In an example, rows 310 may extend in a direction that is perpendicular to the direction of first set of glass rows 210 from one edge 202 to another. For example, if the direction of first set of rows 210 is horizontal, the direction of second set of rows 310 may be vertical. If the direction of first set of rows 210 is vertical, as illustrated in FIGS. 2-5, the direction of second set of rows 310 may be horizontal, as illustrated in FIGS. 2-5. If the direction of first set of rows 210 is diagonal, the direction of second set of rows 310 may be diagonal in a perpendicular direction. In an example, each glass row 310 of the second set of glass rows may have substantially the same width 320 of each other glass row. Additionally, a width 322 of the space between adjacent glass rows 310 may be substantially the same width 320 as each individual glass row. In certain examples, width 320 of rows 310 may be substantially the same as width 220 of rows 210 illustrated in FIG. 2, and width 322 of spaces between rows 310 may be substantially the same as width 222 of the space between rows 210 illustrated in FIG. 2.

Figure 4:
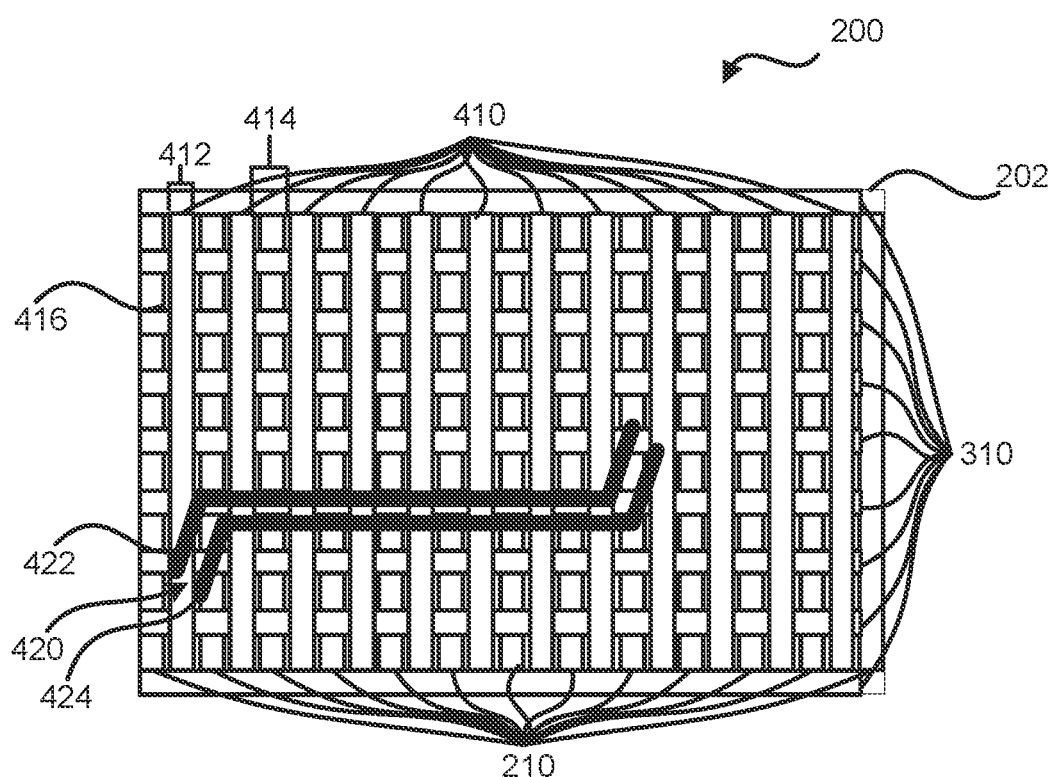

Referring now to FIG. 4, a third set of glass rows 410 may be formed for printed circuit board substrate 200. In an example, rows 410 may extend in a direction that is perpendicular to the direction of second set of glass rows 310 and parallel to the direction of first set of glass rows 210 from one edge 202 to another. In certain examples, each glass row 410 of the third set of glass rows may be located/positioned within or above a different space between glass rows 210 of the first set of glass rows. In an example, each glass row 410 of the third set of glass rows may have a width 412 that is substantially the same width as each other glass row. Additionally, a width 414 of the space between adjacent glass rows 410 may be substantially the same as width 412 of each individual glass row. In certain examples, width 412 of rows 410 may be substantially the same as width 320 of rows 310 of FIG. 3 and width 220 of rows 210 of FIG. 2, and width 414 of spaces between rows 410 may be substantially the same as width 322 of the space between rows 310 of FIG. 3 and width 222 of the space between rows 210 of FIG. 2.

In certain examples, after rows 210, 310, and 410 have been formed in substrate 200, a resin 416 may be applied to the substrate. Resin 416 of printed circuit board substrate 200 may be any suitable resin material, such as FR-4 resin. Resin 416 may bond all glass rows 210, 310, and 410 together, and fill any holes or pockets between the glass rows. In an example, rows 210, 310, and 410 may form a double warp glass configuration, such that any glass/resin pockets may be substantially eliminated.

In an example, a differential pair 420 with traces 422 and 424 may be formed on a surface of printed circuit board substrate 200. In an example, traces 422 and 424 may extend any direction over the surface of printed circuit board substrate 200. In certain examples, the layers or weaving of the sets of glass rows may eliminate substantially all glass/resin pockets within printed circuit board substrate 200. Based on printed circuit board substrate 200 substantially not including any glass/resin pockets, the dielectric constants below traces 422 and 424 may be substantially similar, such that no skew is created between the traces. Based on substrate 200 not having a skew between traces 422 and 424, insertion losses for high speed signals transmitted along the traces may be prevented.

Figure 5:
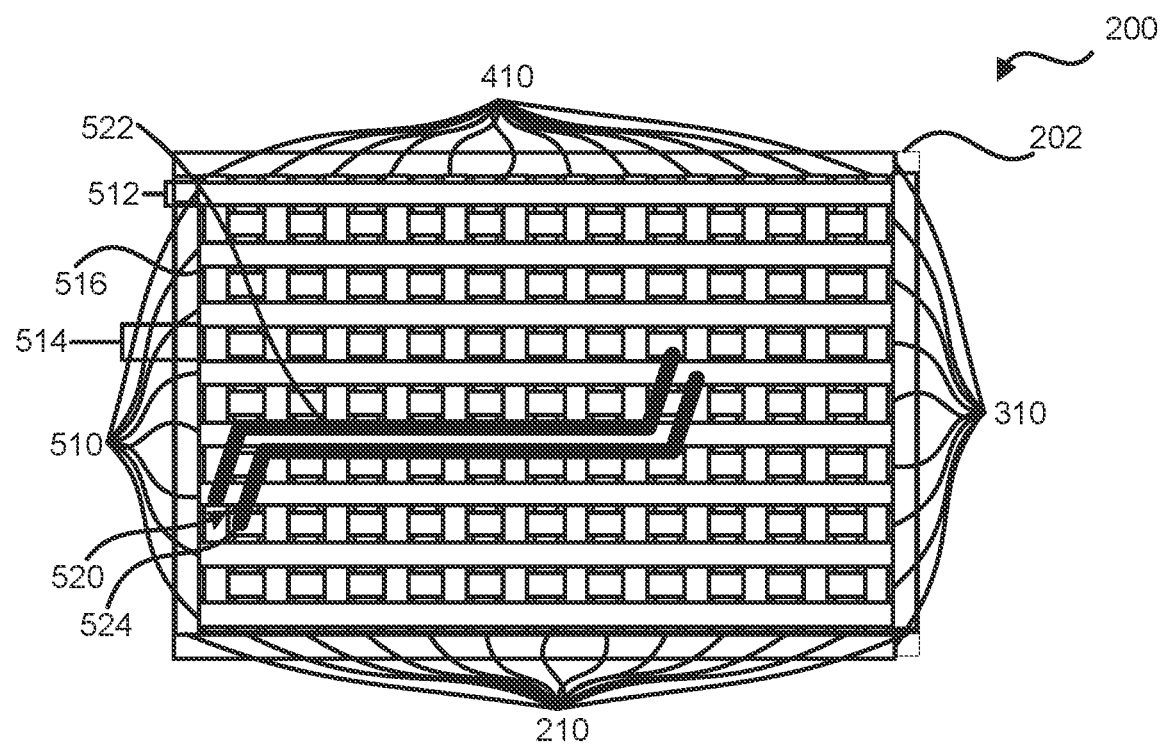

Referring now to FIG. 5, a fourth set of glass rows 510 may be formed for printed circuit board substrate 200. In an example, rows 510 may extend in a direction that is perpendicular to the direction of first and third sets of glass rows 210 and 410 and parallel to the direction of the second set of glass rows 310 from one edge 202 to another. In certain examples, each glass row 410 of the fourth set of glass rows may be located/positioned within or above a different space between glass rows 310 of the second set of glass rows. In an example, each glass row of the fourth set of glass rows may have substantially the same width as each other glass row. Additionally, the space between adjacent glass rows may be substantially is same width as each individual glass row. In an example, each glass row 510 of the fourth set of glass rows may have a width 512 that is substantially the same width as each other glass row. Additionally, a width 514 of the space between adjacent glass rows 510 may be substantially the same as width 512 of each individual glass row. In certain examples, width 512 of rows 510 may be substantially the same as width 412 of rows 410 of FIG. 4, width 320 of rows 310 of FIG. 3, and width 220 of rows 210 of FIG. 2. Width 514 of spaces between rows 510 may be substantially the same as width 414 of the space between rows 410 of FIG. 4, width 322 of the space between rows 310 of FIG. 3, and width 222 of the space between rows 210 of FIG. 2.

In certain examples, after rows 210, 310, 410, and 510 have been formed in substrate 200, a resin 516 may be applied to the substrate. Resin 516 of printed circuit board substrate 200 may be any suitable resin material, such as FR-4 resin. Resin 516 may bond all glass rows 210, 310, 410, and 510 together, and fill any holes or pockets between the glass rows. In an example, glass rows 210, 310, 410, and 510 may form a triple warp glass configuration, such that any glass/resin pockets may be substantially eliminated.

In an example, a differential pair 520 with traces 522 and 524 may be formed on a surface of printed circuit board substrate 200. In an example, traces 522 and 524 may extend any direction over the surface of printed circuit board substrate 200. In certain examples, the layers or weaving of the sets of glass rows may eliminate substantially all glass/resin pockets within printed circuit board substrate 200. Based on printed circuit board substrate 200 substantially not including any glass/resin pockets, the dielectric constants below traces 522 and 524 may be substantially similar, such that no skew is created between the traces. Based on substrate 200 not having a skew between traces 522 and 524, insertion losses for high speed signals transmitted along the traces may be prevented.

Figure 6:
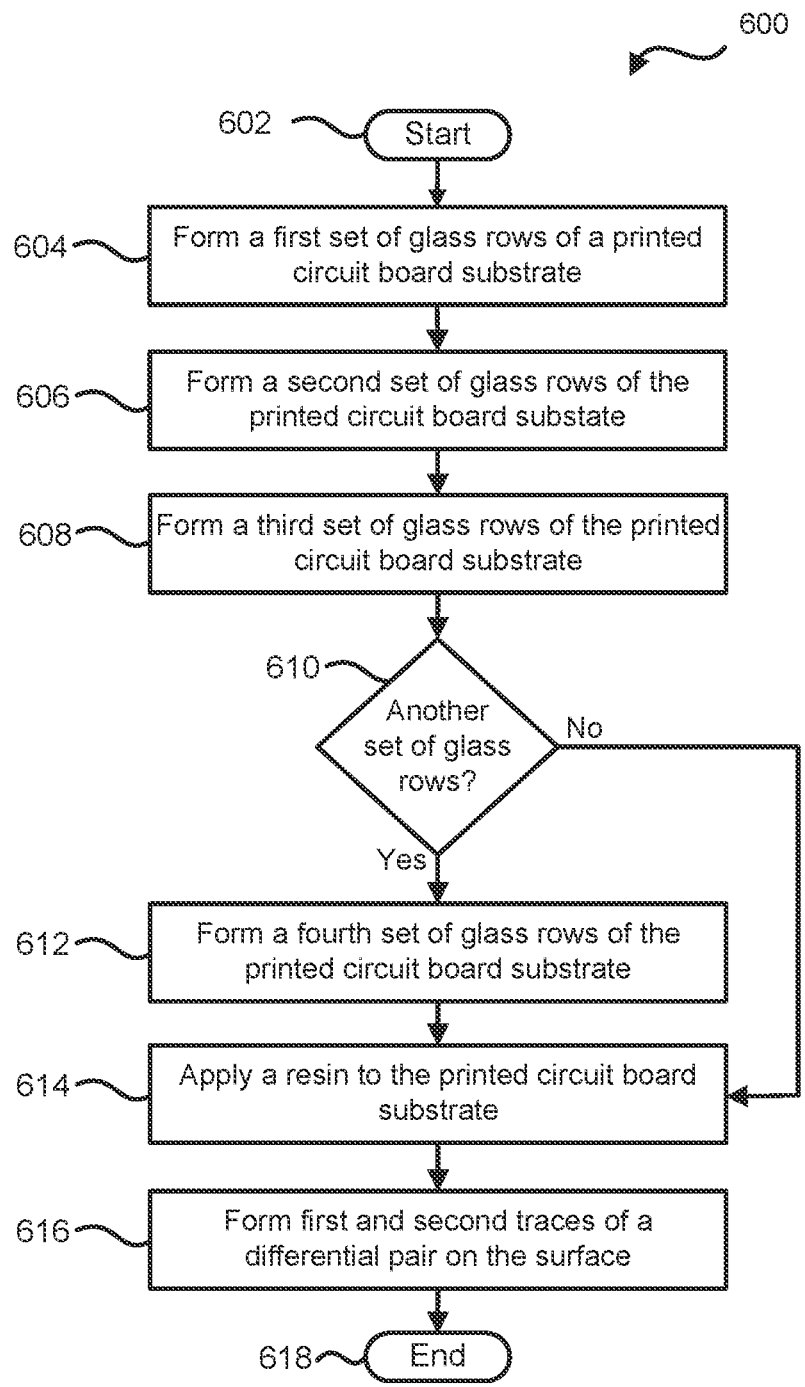
FIG. 6 is a flow diagram of a method for creating a fiber weave substrate for a printed circuit board according to at least one embodiment of the present disclosure.

FIG. 6 illustrates a flow of a method 600 for creating a fiber weave substrate for a printed circuit board according to at least one embodiment of the present disclosure, starting at block 602. In an example, method 600 may be performed by any suitable component including, but not limited to, differential pair 120 of FIG. 1. It will be readily appreciated that not every method step set forth in this flow diagram is always necessary, and that certain steps of the methods may be combined, performed simultaneously, in a different order, or perhaps omitted, without varying from the scope of the disclosure.

At block 604, a first set of glass rows of a printed circuit board substrate is formed. In an example, the rows may extend in any suitable direction across the printed circuit board substrate. For example, the direction of the rows may include, but is not limited to, horizontal rows, vertical rows, and diagonal rows. In certain examples, the glass rows may be formed from any suitable type of glass including, but not limited to, sapphire glass, tempered glass, and quartz glass. In an example, each glass row may have substantially the same width as each other glass row. Additionally, the space between adjacent glass rows may be substantially is same width as each individual glass row.

At block 606, a second set of glass rows of the printed circuit board substrate is formed. In an example, the rows may extend in a direction that is perpendicular to the direction of first set of glass rows. For example, if the direction of the first set of rows is horizontal, the direction of the second set of rows may be vertical. If the direction of the first set of rows is vertical, the direction of the second set of rows may be horizontal. If the direction of the first set of rows is diagonal, the direction of the second set of rows may be diagonal in a perpendicular direction. In an example, each glass row of the second set of glass rows may have substantially the same width as each other glass row. Additionally, the space between adjacent glass rows may be substantially is same width as each individual glass row.

At block 608, a third set of glass rows of the printed circuit board substrate is formed. In an example, the rows may extend in a direction that is perpendicular to the direction of second set of glass rows and parallel to the direction of the first set of glass rows. In certain examples, each glass row of the third set of glass rows may be located/positioned within or above a different space between the glass rows of the first set of glass rows. If the direction of the second set of rows is horizontal, the direction of the third set of rows may be vertical. If the direction of the second set of rows is vertical, the direction of the third set of rows may be horizontal. If the direction of the second set of rows is diagonal, the direction of the third set of rows may be diagonal in a perpendicular direction. In an example, each glass row of the third set of glass rows may have substantially the same width as each other glass row. Additionally, the space between adjacent glass rows may be substantially is same width as each individual glass row.

At block 610, a determination is made whether another set of glass rows is needed in the printed circuit board substrate. In an example, another set of glass rows may be needed based on the type of glass utilized for the glass rows. If another set of glass rows is not needed, the flow continues below at block 614. If another set of glass rows is need, the flow continues at block 612.

At block 612, a fourth set of glass rows of the printed circuit board substrate is formed. In an example, the rows may extend in a direction that is perpendicular to the direction of first and third sets of glass rows and parallel to the direction of the second set of glass rows. In certain examples, each glass row of the fourth set of glass rows may be located/positioned within or above a different space between the glass rows of the second set of glass rows. If the direction of the third set of rows is horizontal, the direction of the fourth set of rows may be vertical. If the direction of the third set of rows is vertical, the direction of the fourth set of rows may be horizontal. If the direction of the third set of rows is diagonal, the direction of the fourth set of rows may be diagonal in a perpendicular direction. In an example, each glass row of the fourth set of glass rows may have substantially the same width as each other glass row. Additionally, the space between adjacent glass rows may be substantially is same width as each individual glass row.

At block 614, a resin is applied to the printed circuit board substrate. The resin of the printed circuit board substrate may be any suitable resin material, such as FR-4 resin. At block 616, first and second traces of a differential pair are formed on a surface of the printed circuit board substrate, and the flow ends at block 618. In an example, the first and second traces may extend any direction over the surface of the printed circuit board substrate. In certain examples, the layers or weaving of the sets of glass rows may eliminate substantially all glass/resin pockets within the printed circuit board substrate. Based on the printed circuit board substrate substantially not including any glass/resin pockets, the dielectric constants below traces between the two traces may be substantially similar, such that no skew is created between the traces. The similar skew between the first and second traces may prevent insertion losses for high speed signals transmitted along the first and second traces.

Figure 7:
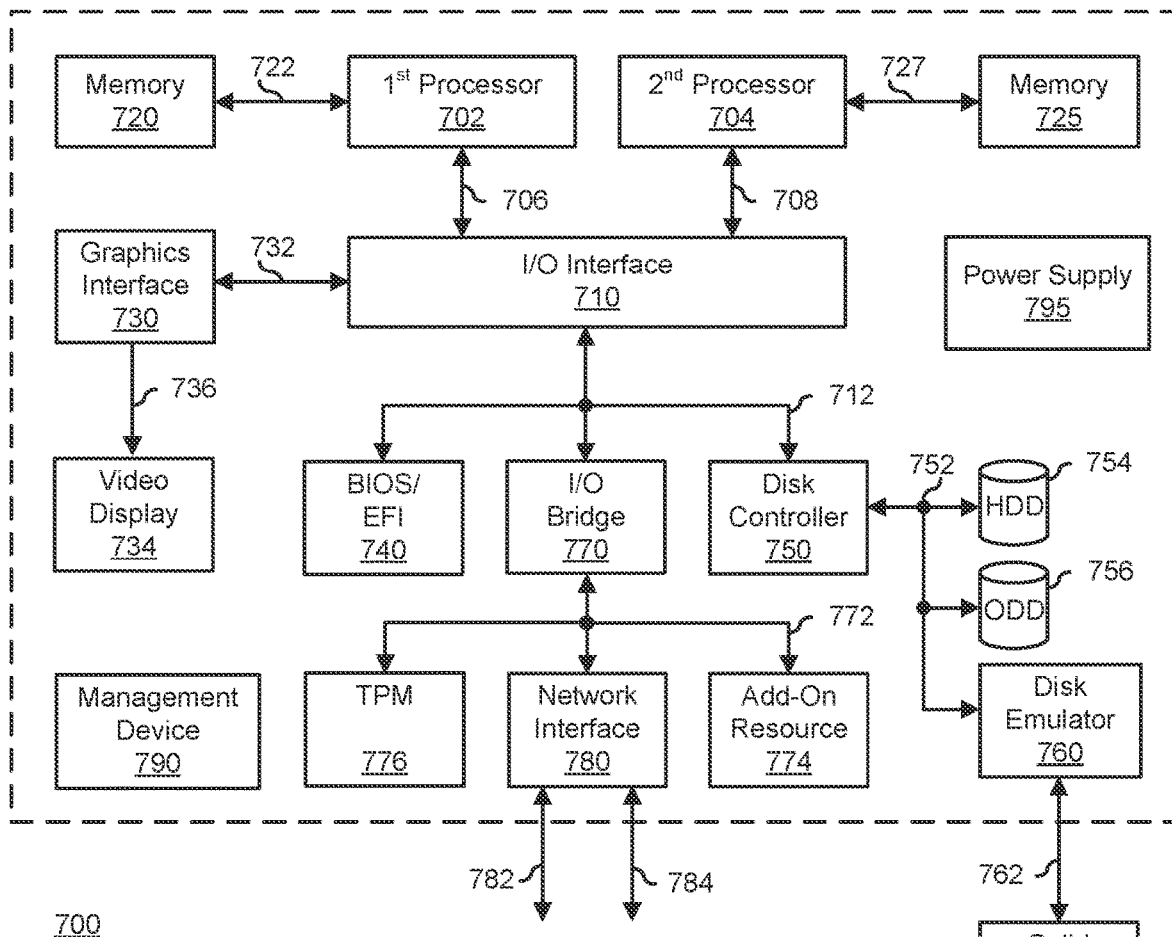
FIG. 7 is a block diagram of a general information handling system according to an embodiment of the present disclosure.

FIG. 7 shows a generalized embodiment of an information handling system 700 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 700 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 700 can include processing resources for executing machine-executable code, such as a central processing unit (CPU), a programmable logic array (PLA), an embedded device such as a System-on-a-Chip (SoC), or other control logic hardware. Information handling system 700 can also include one or more computer-readable medium for storing machine-executable code, such as software or data. Additional components of information handling system 700 can include one or more storage devices that can store machine-executable code, one or more communications ports for communicating with external devices, and various input and output (I/O) devices, such as a keyboard, a mouse, and a video display. Information handling system 700 can also include one or more buses operable to transmit information between the various hardware components.

Information handling system 700 can include devices or modules that embody one or more of the devices or modules described below and operates to perform one or more of the methods described below. Information handling system 700 includes a processors 702 and 704, an input/output (I/O) interface 710, memories 720 and 725, a graphics interface 730, a basic input and output system/universal extensible firmware interface (BIOS/UEFI) module 740, a disk controller 750, a hard disk drive (HDD) 754, an optical disk drive (ODD) 756, a disk emulator 760 connected to an external solid state drive (SSD) 764, an I/O bridge 770, one or more add-on resources 774, a trusted platform module (TPM) 776, a network interface 780, a management device 790, and a power supply 795. Processors 702 and 704, I/O interface 710, memory 720, graphics interface 730, BIOS/UEFI module 740, disk controller 750, HDD 754, ODD 756, disk emulator 760, SSD 764, I/O bridge 770, add-on resources 774, TPM 776, and network interface 780 operate together to provide a host environment of information handling system 700 that operates to provide the data processing functionality of the information handling system. The host environment operates to execute machine-executable code, including platform BIOS/UEFI code, device firmware, operating system code, applications, programs, and the like, to perform the data processing tasks associated with information handling system 700.

In the host environment, processor 702 is connected to I/O interface 710 via processor interface 706, and processor 704 is connected to the I/O interface via processor interface 708. Memory 720 is connected to processor 702 via a memory interface 722. Memory 725 is connected to processor 704 via a memory interface 727. Graphics interface 730 is connected to I/O interface 710 via a graphics interface 732 and provides a video display output 736 to a video display 734. In a particular embodiment, information handling system 700 includes separate memories that are dedicated to each of processors 702 and 704 via separate memory interfaces. An example of memories 720 and 725 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 740, disk controller 750, and I/O bridge 770 are connected to I/O interface 710 via an I/O channel 712. An example of I/O channel 712 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 710 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 740 includes BIOS/UEFI code operable to detect resources within information handling system 700, to provide drivers for the resources, initialize the resources, and access the resources. BIOS/UEFI module 740 includes code that operates to detect resources within information handling system 700, to provide drivers for the resources, to initialize the resources, and to access the resources.

Disk controller 750 includes a disk interface 752 that connects the disk controller to HDD 754, to ODD 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits SSD 764 to be connected to information handling system 700 via an external interface 762. An example of external interface 762 includes a USB interface, an IEEE 4394 (Firewire) interface, a proprietary interface, or a combination thereof. Alternatively, solid-state drive 764 can be disposed within information handling system 700.

I/O bridge 770 includes a peripheral interface 772 that connects the I/O bridge to add-on resource 774, to TPM 776, and to network interface 780. Peripheral interface 772 can be the same type of interface as I/O channel 712 or can be a different type of interface. As such, I/O bridge 770 extends the capacity of I/O channel 712 when peripheral interface 772 and the I/O channel are of the same type, and the I/O bridge translates information from a format suitable to the I/O channel to a format suitable to the peripheral channel 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on separate circuit board or add-in card disposed within information handling system 700, a device that is external to the information handling system, or a combination thereof.

Network interface 780 represents a NIC disposed within information handling system 700, on a main circuit board of the information handling system, integrated onto another component such as I/O interface 710, in another suitable location, or a combination thereof. Network interface device 780 includes network channels 782 and 784 that provide interfaces to devices that are external to information handling system 700. In a particular embodiment, network channels 782 and 784 are of a different type than peripheral channel 772 and network interface 780 translates information from a format suitable to the peripheral channel to a format suitable to external devices. An example of network channels 782 and 784 includes InfiniBand channels, Fibre Channel channels, Gigabit Ethernet channels, proprietary channel architectures, or a combination thereof. Network channels 782 and 784 can be connected to external network resources (not illustrated). The network resource can include another information handling system, a data storage system, another network, a grid management system, another suitable resource, or a combination thereof.

Management device 790 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 700. In particular, management device 790 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 700, such as system cooling fans and power supplies. Management device 790 can include a network connection to an external management system, and the management device can communicate with the management system to report status information for information handling system 700, to receive BIOS/UEFI or system firmware updates, or to perform other task for managing and controlling the operation of information handling system 700.

Management device 790 can operate off of a separate power plane from the components of the host environment so that the management device receives power to manage information handling system 700 when the information handling system is otherwise shut down. An example of management device 790 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 790 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A printed circuit board substrate comprising:
a plurality of sets of glass rows, wherein the plurality of sets of glass rows includes a first set of glass rows, a second set of glass rows, and a third set of glass rows, wherein the first set of glass rows extend in a first direction, the second set of glass rows extend in a second direction that is perpendicular to the first direction, and the third set of glass rows extend in a third direction that is parallel to the first direction, wherein a first width of a space between adjacent glass rows of the first set of glass rows is a same width as a second width of each glass row of the first set of glass rows; and
resin to hold the plurality of sets of glass rows together and to fill pockets between the plurality of sets of glass rows.

2. The printed circuit board substrate of claim 1, wherein each glass row of the first, second, and third sets of glass rows has a same width as each other glass row of the first, second, and third sets of glass rows.

3. The printed circuit board substrate of claim 1, wherein each glass row of the third set of glass rows is located above a different space between glass rows of the first set of glass rows.

4. The printed circuit board substrate of claim 1, further comprising: a fourth set of glass rows, wherein the fourth set of glass rows extend in a fourth direction that is parallel to the second direction.

5. The printed circuit board substrate of claim 4, wherein each glass row of the fourth set of glass rows is located above a different space between glass rows of the second set of glass rows.

6. The printed circuit board substrate of claim 4, wherein the first, second, third, and fourth sets of glass rows form a triple warp glass configuration.

7. The printed circuit board substrate of claim 1, wherein the first, second, and third sets of glass rows form a double warp glass configuration.

8. An information handling system comprising:
a printed circuit board substrate including:
a plurality of sets of glass rows, wherein the plurality of sets of glass rows includes a first set of glass rows, a second set of glass rows, and a third set of glass rows, wherein the first set of glass rows extend in a first direction, the second set of glass rows extend in a second direction that is perpendicular to the first direction, and the third set of glass rows extend in a third direction that is parallel to the first direction, wherein a first width of a space between adjacent glass rows of the first set of glass rows is a same width as a second width of each glass row of the first set of glass rows; and
resin to hold the plurality of sets of glass rows together and to fill pockets between the plurality of sets of glass rows; and
a differential pair having first and second traces, the differential pair being located on a top surface of the printed circuit board substrate.

9. The printed circuit board of claim 8, wherein a first average dielectric constant in the printed circuit board substrate below the first trace equals a second average dielectric constant in the printed circuit board substrate below the second trace.

10. The printed circuit board of claim 8, wherein each glass row of the first, second, and third sets of glass rows has a same width as each other glass row of the first, second, and third sets of glass rows.

11. The printed circuit board of claim 8, wherein each glass row of the third set of glass rows is located above a different space between glass rows of the first set of glass rows.

12. The printed circuit board of claim 8, wherein the printed circuit board substrate further includes: a fourth set of glass rows, wherein the fourth set of glass rows extend in a fourth direction that is parallel to the second direction.

13. The printed circuit board of claim 12, wherein each glass row of the fourth set of glass rows is located above a different space between glass rows of the second set of glass rows.

14. The printed circuit board of claim 12, wherein the first, second, third, and fourth sets of glass rows form a triple warp glass configuration.

15. The printed circuit board of claim 8, wherein the first, second, and third sets of glass rows form a double warp glass configuration.

* * * * *